(12) United States Patent
Finney

(10) Patent No.: US 7,301,745 B2
(45) Date of Patent: Nov. 27, 2007

(54) TEMPERATURE DEPENDENT SWITCHING CIRCUIT

(75) Inventor: Adrian Finney, Oldham (GB)

(73) Assignee: Zetex PLC, Chadderton, Oldham (GB)

( * ) Notice: Subject to any disclaimer, the term of this patent is extended or adjusted under 35 U.S.C. 154(b) by 406 days.

(21) Appl. No.: 10/903,420

(22) Filed: Jul. 29, 2004

(65) Prior Publication Data
US 2005/0041353 A1    Feb. 24, 2005

(30) Foreign Application Priority Data
Jul. 31, 2003    (GB) ................... 0317890.2

(51) Int. Cl.
*H02H 5/04*    (2006.01)
(52) U.S. Cl. ..................... 361/103; 327/512
(58) Field of Classification Search ............... 361/93.8, 361/103; 327/512
See application file for complete search history.

(56) References Cited

U.S. PATENT DOCUMENTS

| | | | |
|---|---|---|---|
| 4,877,982 A * | 10/1989 | Walker | 327/432 |
| 5,642,252 A | 6/1997 | Skatamoto et al. | |
| 6,084,462 A * | 7/2000 | Barker | 327/512 |
| 6,088,208 A * | 7/2000 | Yamaguchi | 361/103 |
| 6,342,997 B1 * | 1/2002 | Khadkikar et al. | 361/103 |

* cited by examiner

*Primary Examiner*—Ronald W. Leja
(74) *Attorney, Agent, or Firm*—Koppel, Patrick, Heybl & Dawson; Michael J. Ram

(57) ABSTRACT

A temperature dependent switching circuit comprises a first transistor with a threshold voltage Vth having a negative temperature coefficient. A diode having a forward voltage drop with a negative temperature coefficient coupled with its anode connected to the drain of the first transistor and its cathode connected to the gate of the first transistor. A first resistor is coupled between a power supply terminal and the drain of the first transistor. A low voltage supply is terminal connected to the source of the first transistor. A second resistor is coupled between the gate of the first transistor and the low voltage supply terminal. A switching transistor has its source connected to the low voltage supply terminal and its gate coupled to the drain of the first transistor. The drain of the first transistor provides a voltage with a negative temperature coefficient equal to the sum of the forward voltage drop across the diode and the threshold voltage of the first transistor. As the temperature in the circuit rises to a predetermined temperature the voltage at the gate of the switching transistor drops below the threshold voltage for the switching transistor turning off the current flowing from the drain to the source of the switching transistor.

6 Claims, 2 Drawing Sheets

TEMPERATURE DEPENDENT SWITCHING CIRCUIT

The present invention relates to a temperature dependent switching circuit. More particularly it relates to an over temperature protection circuit.

Many electrical circuits that include a power transistor, in particular a power FET such as a MOSFET or other insulated gate transistor, include an over temperature protection circuit to switch off the current drawn through the transistor in response to a sensed rise in temperature such that damage to the power transistor or other associated circuitry may be prevented. One form of over temperature switch may be a band gap reference circuit, providing a temperature independent voltage supply, together with a temperature dependent voltage supply such as a forward biased diode and a comparator. The comparator includes at least two transistors to balance out temperature dependent parameters such as transistor threshold voltage. When the voltage across the diode falls below the reference voltage the comparator switches, turning off the current in the associated circuitry.

As the rise in temperature may be due to the current flowing through the over temperature switch and the associated circuitry, removing the current may prevent further temperature increase. The switch off temperature will normally be chosen at a level above that expected to be experienced in normal circuit operation, and below a level at which the over temperature circuit itself, or the associated circuit will be physically damaged.

A band gap reference circuit is implemented using bipolar transistors and is a very common circuit. However, reliance on a bipolar transistor can be a disadvantage in many applications. For example, there are many instances of integrated circuits based on MOSFETS and other simple components such as resistors and diodes, which have fabrication processes which do not lend themselves to the practical inclusion of bipolar structures.

It is an object of the present invention to obviate or mitigate the above disadvantages.

According to the present invention there is provided a temperature dependent switching circuit comprising:
a first transistor with a threshold voltage Vth having a negative temperature coefficient;
a diode having a forward voltage drop with a negative temperature coefficient coupled with its anode connected to the drain of the first transistor and its cathode connected to the gate of the first transistor;
a power supply terminal;
a first resistor coupled between the power supply terminal and the drain of the first transistor;
a low voltage supply terminal connected to the source of the first transistor;
a second resistor coupled between the gate of the first transistor and the low voltage supply terminal; and
a switching transistor with its source connected to the low voltage supply terminal and its gate coupled to the drain of the first transistor;
wherein the drain of the first transistor provides a voltage with a negative temperature coefficient equal to the sum of the forward voltage drop across the diode and the threshold voltage of the first transistor, such that as the temperature in the circuit rises to a predetermined temperature the voltage at the gate of the switching transistor drops below the threshold voltage for the switching transistor turning off the current flowing from the drain to the source of the switching transistor.

The present invention is designed such that it may be integrated into a circuit utilising a smart MOSFET fabrication process where only MOSFETs, diodes and resistors are used resulting in a low mask count. This low mask count provides cost savings over other integrated circuit types.

In a preferred embodiment of the present invention the first transistor and the switching transistor are matched, such that this removes any absolute and temperature dependent variation in the threshold voltage of the two transistors, such that the temperature dependent switching circuit relies only on the temperature dependent voltage of the diode. This prevents slight differences between the threshold voltages moving the over temperature turn off point. A further advantage is that as the threshold voltage of the first transistor is cancelled out and the temperature coefficient is primarily dependent on the diode, the temperature dependent switching circuit is capable of working at low voltages.

Other objects and advantages of the various aspects of the present invention will become apparent from the following description.

Specific embodiments of the present invention will now be described, by way of example only, with reference to the accompanying drawings, in which.

Figure 1:
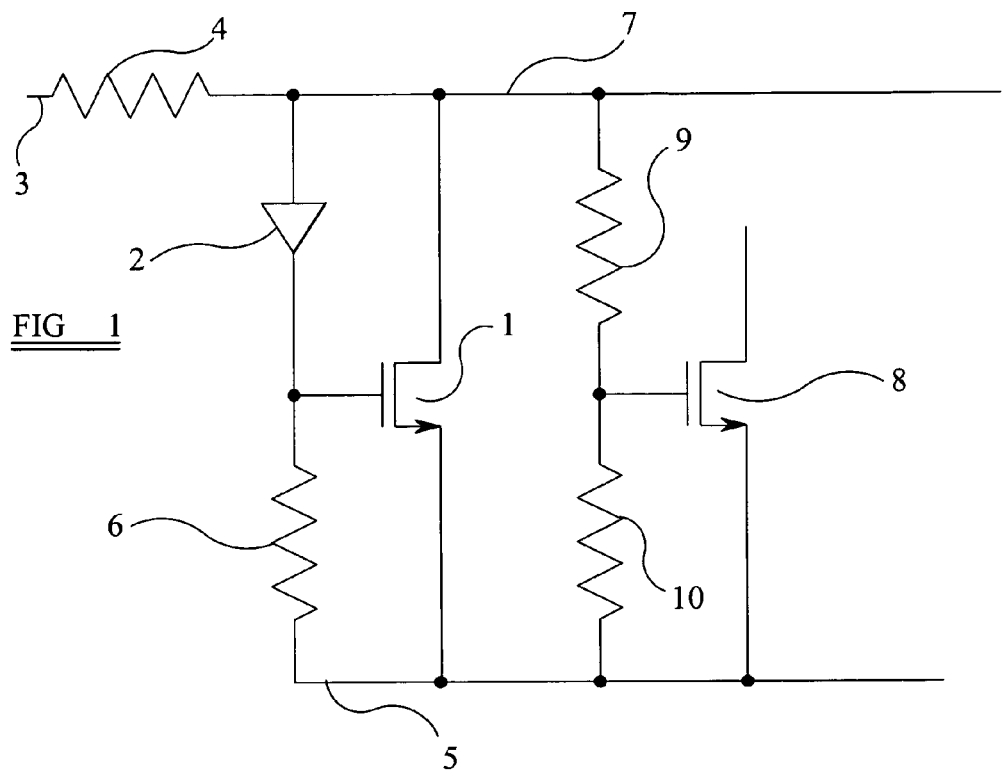
FIG. 1 illustrates a temperature dependent switching circuit in accordance with a first embodiment of the present invention.

Referring first to FIG. 1, this shows a temperature dependent switching circuit in accordance with a first embodiment of the present invention. The illustrated circuit comprises a first transistor 1, a diode 2, a supply voltage 3 (which may be unregulated), a first transistor 4, a low voltage supply rail 5 (typically ground), a second resistor 6, a switching transistor 8, a third resistor 9 and a fourth resistor 10.

The circuit is fed by the supply voltage 3, which causes current to flow through resistor 4, diode 2 and resistor 6, which are connected in series between the supply voltage 3 and the low voltage rail 5. The supply voltage 3 is positive with respect to the low voltage rail 5. The diode 2 is forward biased thus allowing current to flow.

Transistor 1 is coupled between the junction of resistor 4 and diode 2 and the low voltage rail 5. That is, the drain of transistor 1 is connected to the junction of resistor 4 and diode 2 and the source is connected to the low voltage rail 5. The gate contact of transistor 1 is connected to the junction between diode 2 and resistor 6.

Switching transistor 8 is coupled to the drain of transistor 1. The coupling means is via a potential divider consisting of two resistors 9 and 10, coupled in series between the drain of the first transistor 1 and the low voltage supply 5, such that they pass a proportion of the voltage from the drain of the first transistor 1. The voltage applied to the gate of the over temperature switch transistor 8 is dependent on the relative resistance values of resistors 9 and 10. The source of the switching transistor 8 is connected to the low voltage rail.

Operation of the circuit will now be described:

The power for the circuit is provided by the supply voltage 3. The voltage at the drain of the first transistor 1 is fixed with respect to the low voltage rail 5 of the circuit such that it varies approximately linearly with changes of temperature in the circuit, with no regard to the voltage level of the supply voltage 3 (assuming this remains higher than the voltage at the drain of the first transistor 1 such that diode 2 remains forward biased). The function of resistor 4 is to accommodate the voltage drop between the unregulated supply voltage 3 and the drain of the first transistor 1, point 7.

The voltage at the drain of the first transistor 1 is the sum of the voltage drop across the diode 2 (Vf) plus the threshold voltage for transistor 1 (Vth). Both Vf and Vth have a negative temperature coefficient (i.e. they reduce with increasing temperature) therefore the drain of the first transistor 1 Vf+Vth has a negative temperature coefficient.

Figure 3:
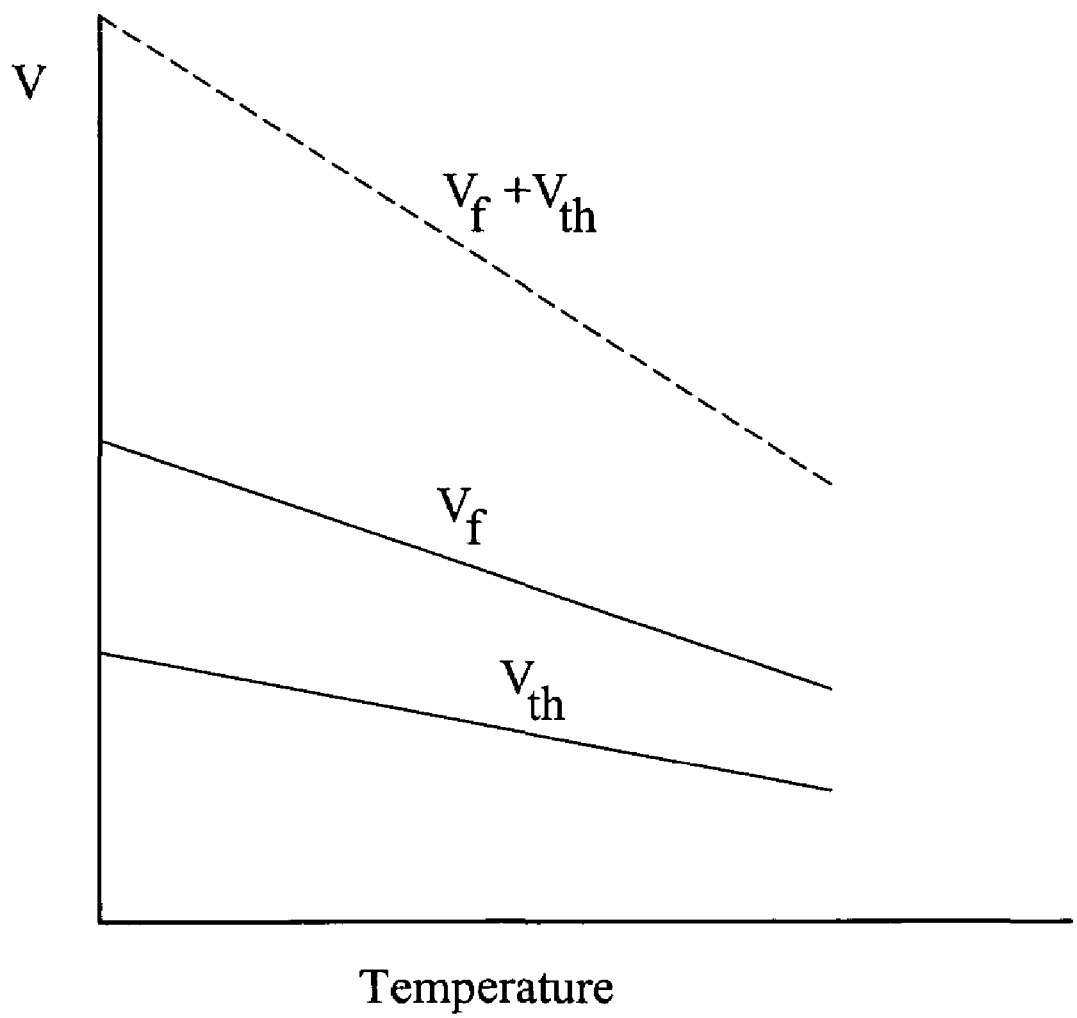
FIG. 3 is a graph showing the variation of voltage with temperature of components of the circuits of FIG. 1.

FIG. 3 shows the relationship between temperature and voltage for Vf, Vth and Vf+Vth. Resistor 6 allows a current to flow through diode 2, (and thus create the voltage drop Vf). The magnitude of this current is fixed by its resistance and the voltage applied across it Vth, which is the result of it bridging the gate and the source of transistor 1.

Collectively resistor 4, diode 2, resistor 6 and transistor 1 therefore function as a temperature sensor deriving a temperature dependent voltage at the drain of the first transistor 1 (with respect to the low voltage rail 5) from the supply voltage 3.

The values of resistors 9 and 10 are selected so that if the temperature rises to a predetermined level the proportion of the voltage at the drain of the first transistor 1 applied to the gate of the switching transistor 8 drops below the threshold voltage of the switching transistor 8, turning off the current flowing from the drain to the source.

Typically, the drain of the switching transistor 8 would be connected to associated circuitry, which is thereby controlled by this over temperature protection circuit in that when the switching transistor 8 is turned off no current can flow through the transistor and therefore no current can flow in the associated circuitry. While the temperature is below the switch off temperature switching transistor 8 is switched on. When the temperature rises above the switch off temperature the transistor 8 is switched off preventing damage to the associated circuitry through overheating.

The potential divider of resistors 9 and 10 eases the design of the circuit such that the choice of diode 2 and first transistor 1 can be determined by the need to provide the maximum negative temperature coefficient for a fast speed of response to rising temperature. The potential divider is then used to pass an appropriate proportion of the voltage at the temperature dependent voltage rail to the gate of the switching transistor. It is possible to form a simpler circuit whereby the gate of the switching transistor 8 is connected directly to the drain of the first transistor 1, if the voltage at drain of the first transistor 1 can be designed to pass through the threshold voltage of the switching transistor 8 at the required temperature.

The threshold voltage of switch transistor 8 is also temperature dependent with a negative temperature coefficient. To avoid having to account for possible variations in this temperature dependence it is advantageous to match transistors 1 and 8 so that the effects of varying Vth, (absolute due to differences in production and temperature induced) are eliminated. For instance, these transistors may be matched with relative ease if they are integrated within the same IC. If this is done then the switch transistor 8 is switched by that fraction of Vf alone that reaches the gate through the potential divider.

It will be appreciated that many modifications could be made to the circuit described above to suit particular applications and to provide enhancements where necessary. For example, increasing the negative temperature coefficient increases the slew rate of the voltage at the gate of transistor 8 with changing temperature. The slew rate can thus be increased by introducing other negative temperature coefficients into the circuit. An example of such an enhancement to the circuit illustrated in FIG. 1 is illustrated in FIG. 2.

Figure 2:
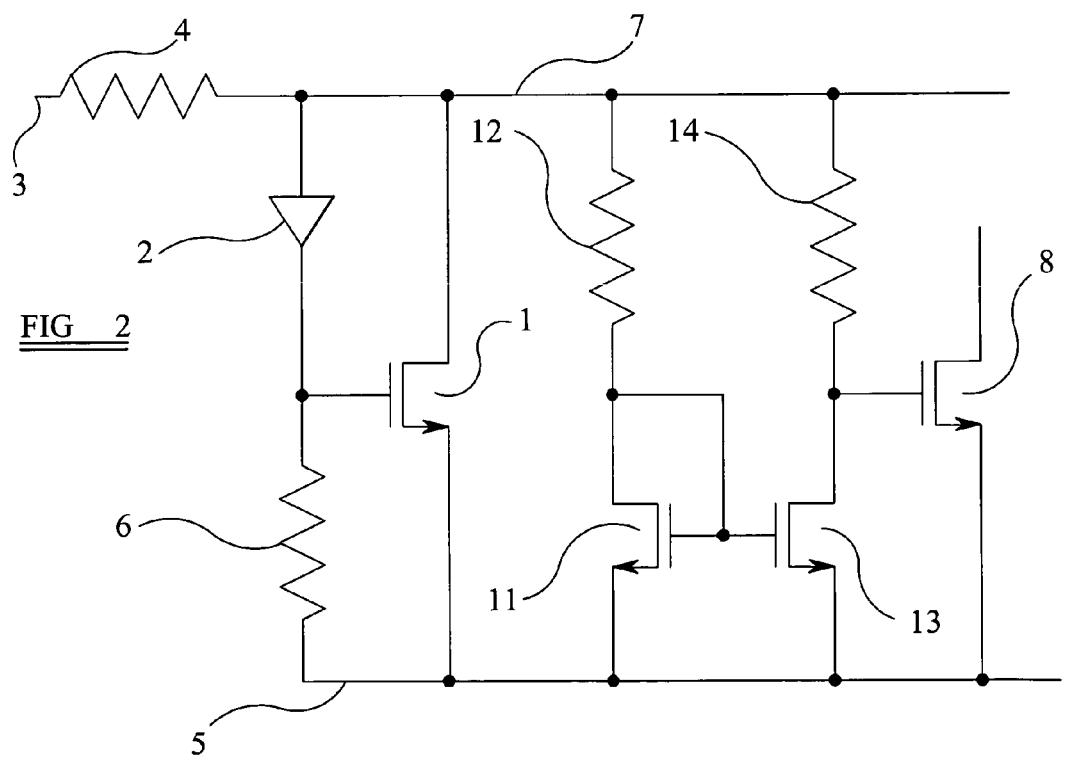
FIG. 2 illustrates a temperature dependent switching circuit in accordance with a second embodiment of the present invention.

Referring to FIG. 2, this illustrates a modification of the circuit of FIG. 1, in which the potential divider arrangement of resistors 9 and 10 is replaced with an active arrangement comprising a current mirror coupled between the drain of the first transistor 1 and the low voltage rail 5.

The current mirror comprises transistors 11 and 13 together with resistors 12 and 14. Transistor 11 is a control transistor having its gate connected to its drain and its source connected to the low voltage rail 5. Resistor 12 is coupled between the drain of the first transistor 1 and the drain/gate of control transistor 11. Transistor 13 is connected back to back with control transistor 11, i.e. the gates of transistors 11 and 13 are connected. The source of transistor 13 is connected to the low voltage rail 5. Resistor 14 is coupled between the drain of the first transistor 1 and the drain of transistor 13. The gate of the switching transistor 8 is connected to the drain of transistor 13, (the output of the current mirror).

The effect of control transistor 11 in series with resistor 12 is that there is a broadly constant voltage drop across transistor 11, therefore for a given level of the voltage at the drain of the first transistor 1 a broadly constant current flows through resistor 12, (determined by the size of the resistance 12), and transistor 11. This current is mirrored through resistor 14 and transistor 13, in a proportion dependent on the relative sizes of transistors 11 and 13 and the ratio of resistors 12 and 14. This magnified or reduced current gives rise to a predetermined voltage drop across resistor 14, (again for a given value of the temperature dependent voltage), from the drain of the first transistor 1. The voltage at the drain of transistor 13 connected to the gate of switch transistor 8 such that at a predetermined temperature the voltage at the gate of the switching transistor drops below the threshold voltage of the switching transistor turning off the current flowing from the drain to the source.

In a transistor with increasing temperature a reducing Vth is offset by an increasing on resistance (RDSON) giving rise to a temperature independent component of the device current. The total device current is the sum of a number of separate device currents and thus may be temperature independent, or have a negative or positive temperature coefficient. By the appropriate dimensioning of the elements within this current mirror, resistors 12 and 14 and transistors 11 and 13 a desired temperature coefficient at the output of the current mirror can be obtained.

If the current passing through resistor 14 and transistor 13 is configured to have a positive temperature coefficient then given a constant resistance the voltage drop across resistor 14 will have a positive coefficient. The effect of this is to cause the output of the current mirror, (the voltage at the drain of the first transistor 1 minus the voltage drop across resistor 14), to be a voltage with a greater negative temperature coefficient than the voltage at the drain of the first transistor 1. This then provides better switching performance to the switching transistor 8 as described above. This reduces the sensitivity of the switching to electrical noise and component tolerances within this circuit.

Further possible modifications and applications of the present invention will be readily apparent to the appropriately skilled person. For example a Widlar current mirror may prove useful in avoiding very large differences in resistor values for resistors 12 and 14, which may otherwise have been necessary due to the desired temperature coefficient or regulated voltage, and which are difficult to fabricate.

The invention claimed is:

1. A temperature dependent switching circuit comprising:
   a first transistor with a threshold voltage Vth having a negative temperature coefficient;
   a diode having a forward voltage drop with a negative temperature coefficient coupled with its anode connected to the drain of the first transistor and its cathode connected to the gate of the first transistor;
   a power supply terminal;
   a first resistor coupled between the power supply terminal and the drain of the first transistor;
   a low voltage supply terminal connected to the source of the first transistor;
   a second resistor coupled between the gate of the first transistor and the low voltage supply terminal; and
   a switching transistor with its source connected to the low voltage supply terminal and its gate coupled to the drain of the first transistor;
   wherein the drain of the first transistor provides a voltage with a negative temperature coefficient equal to the sum of the forward voltage drop across the diode and the threshold voltage of the first transistor, such that as the temperature in the circuit rises to a predetermined temperature the voltage at the gate of the switching transistor drops below the threshold voltage for the switching transistor turning off the current flowing from the drain to the source of the switching transistor.

2. A temperature dependent switching circuit according to claim 1, wherein the first transistor and the switching transistor are matched such that they exhibit the same threshold voltage and threshold voltage temperature dependence.

3. A temperature dependent switching circuit according to claim 1, wherein the drain of the first transistor is coupled to the gate of the switching transistor via a potential divider comprising two resistors coupled in series between the drain of the first transistor and the low voltage supply, with the gate of the switching transistor connected to the junction between said two resistors.

4. A temperature dependent switching circuit according to claim 1, wherein the drain of the first transistor is coupled to the gate of the switching transistor via an active current mirror comprising:
   second and third transistors with their gates connected together, their sources connected to the low voltage supply and the drain of the second transistor connected to the gate of the second transistor;
   a third resistor connected between the drain of the first transistor and the drain of the second transistor; and
   a fourth resistor connected between drain of the first transistor and the drain of the third transistor, with the gate of the switching transistor connected to the drain of the third transistor;
   wherein the active current mirror improves the slew rate of the voltage at the gate of the switching transistor with change of temperature by making the temperature coefficient of the voltage applied to the gate of the switching transistor more negative.

5. A temperature dependent switching circuit according to claim 1, wherein the temperature dependent switching circuit is an over temperature protection circuit, such that at a predetermined temperature the voltage at the gate of the switching transistor drops below the threshold voltage for the switching transistor turning off the current flowing from the drain to the source of the switching transistor in order to prevent damage to both the switching transistor and associated load circuitry through overheating.

6. A temperature dependent switching circuit according to claim 2, wherein the drain of the first transistor is coupled to the gate of the switching transistor via a potential divider comprising two resistors coupled in series between the drain of the first transistor and the low voltage supply, with the gate of the switching transistor connected to the junction between said two resistors.

* * * * *